US012589395B2

(12) United States Patent
Wagner et al.

(10) Patent No.: US 12,589,395 B2
(45) Date of Patent: Mar. 31, 2026

(54) SAMPLE TRAY AND APPARATUS FOR CALORIMETRIC OR THERMOANALYTICAL INVESTIGATION COMPRISING SAID SAMPLE TRAY

(71) Applicant: Mettler-Toledo GmbH, Greifensee (CH)

(72) Inventors: Matthias Wagner, Villigen (CH); Samuel Schneider, Zollikon (CH)

(73) Assignee: Mettler-Toledo GmbH, Greifensee (CH)

( * ) Notice: Subject to any disclaimer, the term of this patent is extended or adjusted under 35 U.S.C. 154(b) by 356 days.

(21) Appl. No.: 18/371,715

(22) Filed: Sep. 22, 2023

(65) Prior Publication Data

US 2024/0100526 A1 Mar. 28, 2024

(30) Foreign Application Priority Data

Sep. 26, 2022 (EP) .................................... 22197862

(51) Int. Cl.
*G01N 5/04* (2006.01)
*B01L 3/00* (2006.01)
(Continued)

(52) U.S. Cl.
CPC ....... *B01L 3/508* (2013.01); *B01L 2300/0803* (2013.01); *B01L 2300/1822* (2013.01);
(Continued)

(58) Field of Classification Search
CPC .... B01L 2300/1822; B01L 3/508; B01L 7/52; B01L 7/525; B01L 7/5255;
(Continued)

(56) References Cited

U.S. PATENT DOCUMENTS 4,950,608 A * 8/1990 Kishimoto ......... G05D 23/1919
                                                        219/439
5,710,381 A * 1/1998 Atwood .................... B01L 7/52
                                                        422/550
(Continued)

FOREIGN PATENT DOCUMENTS

JP        3347977 B2 * 11/2002 .............. F25B 21/02
WO    WO-0108800 A1 * 2/2001 ................ B01L 7/54
WO    2007/150043 A2    12/2007

OTHER PUBLICATIONS

Computer translation of JP-3347977-B2 (Year: 2025).*
(Continued)

*Primary Examiner* — Randy W Gibson
(74) *Attorney, Agent, or Firm* — Standley Law Group LLP; Jeffrey S. Standley; Adam J. Smith

(57) ABSTRACT

The present invention is generally related to a sample tray for holding a sample of a material ready for a calorimetric or a thermoanalytical investigation and to an apparatus for a calorimetric or a thermoanalytical investigation comprising a calorimetric or a thermoanalytical measuring apparatus and said sample tray associated therewith. The sample tray includes a receptacle adapted to enclose an inner tray space (Continued)

for accommodating the sample and a heat transport means for causing heat to flow between the inner tray space and an outer side of the receptacle.

15 Claims, 2 Drawing Sheets

(51) Int. Cl.
  *G05D 23/19* (2006.01)
  *H10N 10/10* (2023.01)

(52) U.S. Cl.
  CPC .................. *B01L 2300/1838* (2013.01); *B01L 2300/1883* (2013.01); *G01N 5/04* (2013.01); *G05D 23/1919* (2013.01); *H10N 10/10* (2023.02)

(58) Field of Classification Search
  CPC ..... B01L 2300/1838; B01L 2300/1883; G01N 5/04; H10N 10/10; H10N 10/13; G05D 23/1919
  See application file for complete search history.

(56) References Cited

U.S. PATENT DOCUMENTS

| | | | | | |
|---|---|---|---|---|---|
| 6,337,435 | B1 * | 1/2002 | Chu | .................. | G05D 23/1919 |
| | | | | | 422/550 |
| 6,489,111 | B1 * | 12/2002 | Takahashi | ........... | B01L 3/50853 |
| | | | | | 435/6.12 |
| 6,703,236 | B2 * | 3/2004 | Atwood | .............. | B01L 3/50853 |
| | | | | | 422/65 |
| 6,977,145 | B2 * | 12/2005 | Fouillet | .................. | G01N 35/08 |
| | | | | | 435/6.19 |
| 7,133,726 | B1 * | 11/2006 | Atwood | ................. | H10N 10/13 |
| | | | | | 137/66 |
| 2009/0031826 | A1 | 2/2009 | Stirn et al. | | |

OTHER PUBLICATIONS

"Peltier Elements" from Meerstetter Engineering webpage at <https://www.meerstetter.ch/customer-center/compendium/70-peltier-elements?srsltid=AfmBOoohVLUoaUHj3WYcYRZp6U_K4dsBWLENP04Co5r0p5obatsqnQfr> (Year: 2025).*
"What is a Heat Exchanger" from Thermex Temperature Engineering webpage <https://www.thermex.co.uk/what-is-a-heat-exchanger/> (Year: 2025).*

* cited by examiner

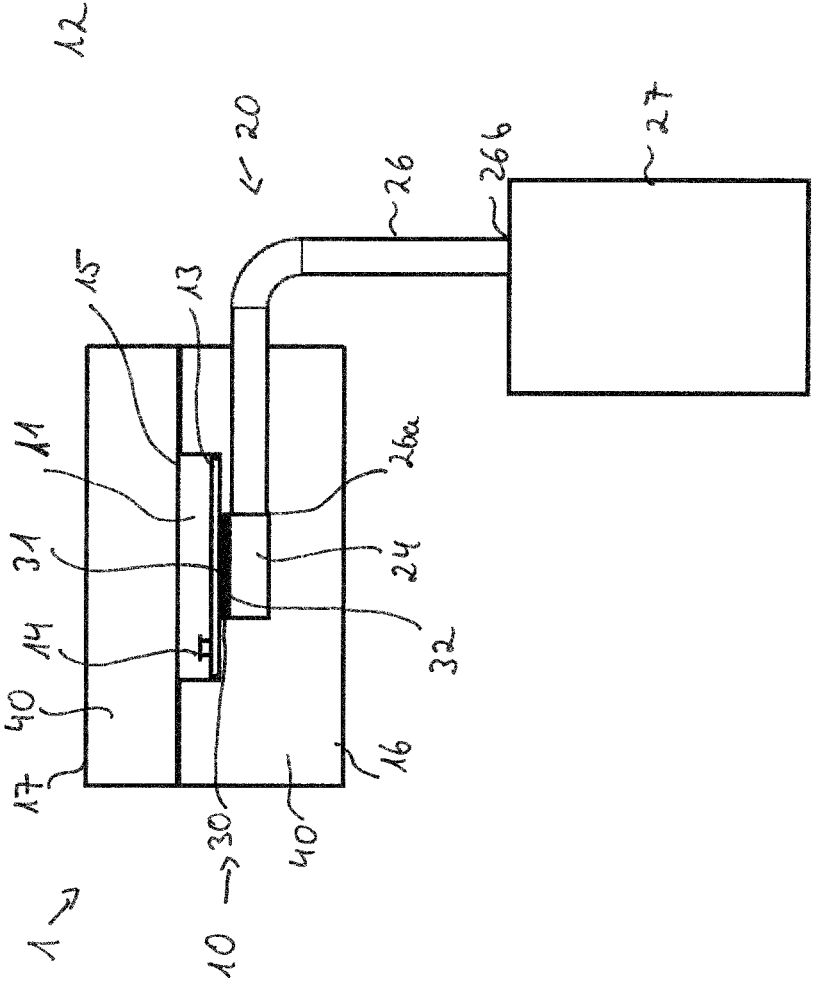

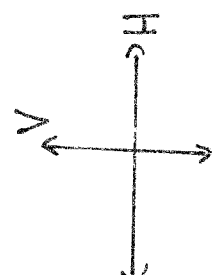
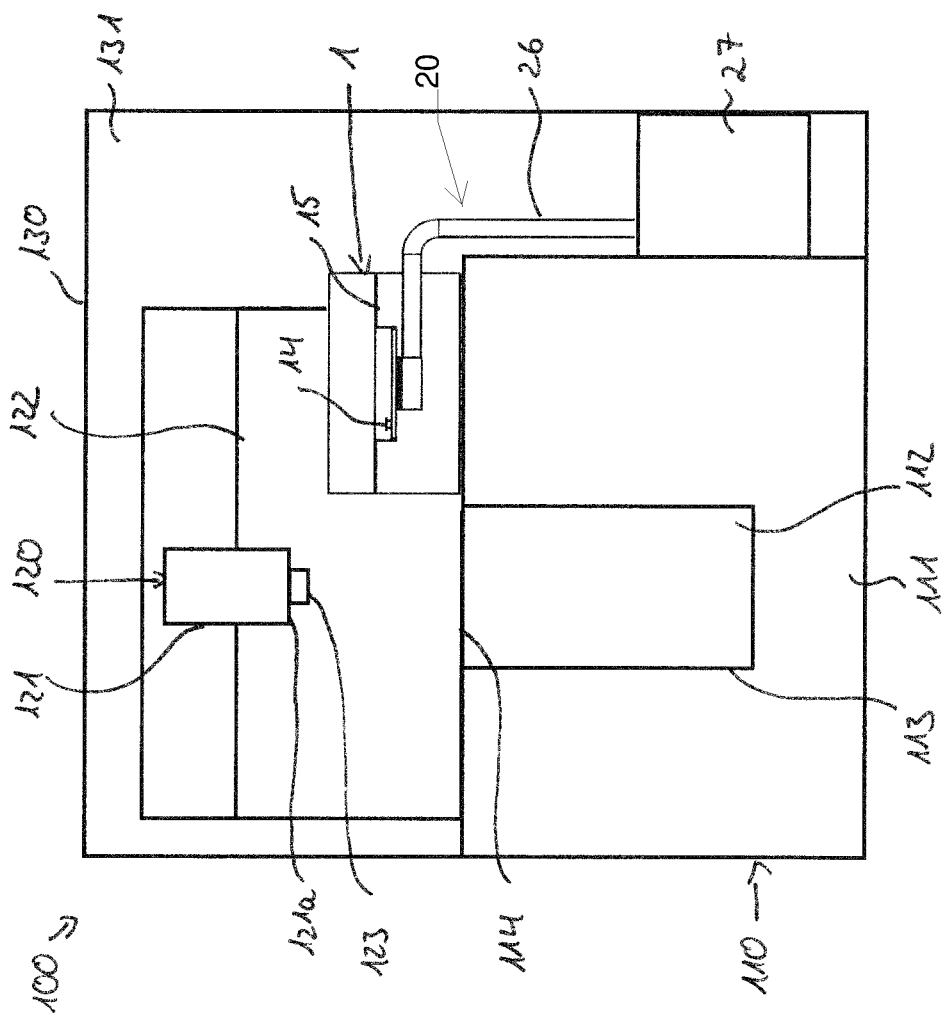
Fig. 2

SAMPLE TRAY AND APPARATUS FOR CALORIMETRIC OR THERMOANALYTICAL INVESTIGATION COMPRISING SAID SAMPLE TRAY

CROSS-REFERENCE TO RELATED APPLICATIONS

This application claims the benefit of European Patent Application No. 22197862.0 filed Sep. 26, 2022, the disclosures of which are hereby incorporated by reference as if fully restated herein.

TECHNICAL FIELD

Exemplary embodiments relate generally to sample trays and apparatuses for calorimetric or thermoanalytical investation comprising the sample tray.

BACKGROUND AND SUMMARY OF THE INVENTION

The present invention is related to a sample tray for holding a sample of a material ready for a calorimetric or a thermoanalytical investigation and to an apparatus for a calorimetric or a thermoanalytical investigation comprising a calorimetric or a thermoanalytical measuring apparatus and said sample tray associated therewith.

Within the following description, the term calorimetric or thermoanalytical investigation encompasses various measurement methods, including but not limited to calorimetry, differential scanning calorimetry (DSC), thermogravimetric analysis (TGA), the determination of the dielectric constant and combinations of these methods.

Certain types of these investigations comprise arranging at least one sample of a material in a furnace of a calorimetric or a thermoanalytical measuring apparatus which is adapted to subject the sample material to a temperature program. The properties of the material are studied as they change with temperature.

Conventionally, one or more samples of a material are prepared by an operator under ambient conditions of a laboratory. The sample or samples ready for calorimetric or thermoanalytical investigation are then arranged on a sample tray for holding one or more such samples. The sample tray is transported by the operator under ambient conditions to the measuring apparatus. One or more samples are then inserted, either manually or automatically, into said furnace.

For certain types of investigations it might however be beneficial or even necessary to provide the sample to the furnace under controlled ambient conditions, e.g., regarding humidity, absence of oxygen, and most importantly, temperature.

It is thus an object of the present invention to develop means to provide a sample to a calorimetric or a thermoanalytical measuring apparatus under controlled ambient conditions.

According to a first aspect of the present invention, this object is attained by a sample tray for holding a sample of a material ready for a calorimetric or a thermoanalytical investigation, wherein said sample tray comprises a receptacle adapted to enclose an inner tray space for accommodating said sample and heat transport means for causing heat to flow between said inner tray space and an outer side of said receptacle.

Due to the heat flow caused by the heat transport means of the sample tray according to the first aspect of the present invention it is possible to control the temperature of the sample arranged in the receptacle up to the moment where the sample is used for the calorimetric or the thermoanalytical investigation, e.g., up to the moment where the sample is inserted into a furnace.

The receptacle may have any form that allows the insertion of a desired number of samples into the inner tray space. For example, the receptacle and/or inner tray space may have the form of a cuboid.

The heat transport means may cause heat to flow between said inner tray space and an outer side of said receptacle such that cooling of the sample with respect to ambient laboratory conditions is achieved. I.e., heat is transported from the inner tray space to the outer side of said receptacle. In this way, a cooling of the sample to temperatures just below room temperature may be achieved. Alternatively, the sample may be cooled to temperatures as low as −30° C. or even more.

Alternatively, the heat transport means may cause heat to flow between said inner tray space and an outer side of said receptacle such that heating of the sample with respect to ambient laboratory conditions is achieved. I.e., heat is transported from the outer side of said receptacle to the inner tray space.

In one embodiment of the first aspect of the present invention said heat transport means may comprise a thermoelectrical Peltier cooler arranged within said inner tray space, said Peltier cooler having a heat-absorbing side and a heat-releasing side, and said heat transport means may comprise means to cause heat to flow between at least one side of the Peltier cooler and the outer side of the receptacle.

In such an embodiment, the heat-absorbing side of the Peltier cooler may be in thermal contact with the sample and the heat transport means may comprise means to transfer heat from said heat-releasing side to the outer side of said receptacle. In this way, a cooling of the sample may be achieved.

There may also be embodiments where the heat-releasing side of the Peltier cooler may be in thermal contact with the sample and the heat transport means may comprise means to transfer heat from the outer side of said receptacle to the heat-absorbing side. In this way, heating of the sample may be achieved.

A Peltier cooler is advantageous in that it has a long lifetime, does not require moving parts or a circulating liquid, has a small size and is flexible in shape. Furthermore, very low temperatures, e. g. in the range of −30° C. may be achieved.

The heat transport means of the sample tray according to the first aspect of the present invention may comprise a heat exchanger. When the heat transport means comprises the Peltier cooler used for cooling of the sample as described above, the heat exchanger may be in thermal contact with the heat-releasing side of the Peltier cooler. The heat exchanger may be adapted to transport the heat from the heat-releasing side to the outer side of the receptacle. When the heat transport means comprises the Peltier cooler used for heating of the sample as described above, the heat exchanger may be in thermal contact with the heat-absorbing side of the Peltier cooler. The heat exchanger may be adapted to transport the heat from the outer side of the receptacle to the heat-absorbing side.

In one embodiment of the first aspect of the present invention said heat transport means may comprise a heat transfer medium circulating in a circuit that extends between said inner tray space and said outer side of said receptacle. Said heat transfer medium may be water. The circuit may comprise a pipe.

The sample tray may further comprise a support for a sample pan, said support being arranged within said inner tray space and being in thermal contact with said heat transport means. For example, when the heat transport means comprises the Peltier cooler for cooling the sample as described above, the heat-absorbing side of the Peltier cooler may be in thermal contact with the support and/or the sample pan.

In one embodiment, the support is equipped to support a plurality of sample pans for example arranged in a circle, in a rectangular pattern or in a pattern where the samples are arranged in rows of which every second one is shifted with respect to the neighboring rows by half of the distance between two sample pans in a row. Such a support allows to keep a plurality of samples at the controlled ambient conditions. In one embodiment, the support holds 48 or 96 sample pans.

The support may have any shape that is practical for supporting at least one sample pan. E.g., the support maybe disc-shaped. The support may be mounted such that it is rotatable around an axis of rotation. The support may be adapted to support at least one sample pan. The sample pan may be mountable on the support and removable from said support. A sample pan may be adapted to receive one sample of the material. Furthermore, the sample pan may be adapted to be arranged at a measuring position, e. g. in a furnace, of a calorimetric or thermoanalytical measuring apparatus.

In one embodiment of the first aspect of the present invention, the receptacle may comprise an opening for inserting said sample into said inner tray space and for removing said sample from said inner tray space, and a cover adapted to close the opening in a first position and to release the opening in a second position thereby enabling inserting and removal of said sample. The receptacle may comprise two parts. The first part may be a receiving part adapted to receive said sample. The receiving part may enclose the inner tray space except in a region where the opening is defined. The second part may be a cover adapted to close the opening in said first position and to release said opening in said second position. The cover may be connected to said receiving part, e.g., via a hinge. Alternatively, it may be possible to completely disconnect said cover from said receiving part thereby releasing the opening of the receptacle.

The sample tray may further comprise a gas inlet for introducing gas into the inner tray space and a gas outlet for removing gas from the inner tray space thereby allowing a gas flow through said inner tray space. The gas flowing through the inner tray space may allow to control, among others, the humidity and/or the oxygen conditions within said inner tray space. The gas flow depends, e. g., on the volume and the inner geometry of the inner tray space.

In one embodiment the sample tray may further comprise an insulation for thermally insulating the inner tray space from the outer side. In this way, the temperature within the inner tray space, and thereby the temperature of the sample may be maintained more easily and more stably. The insulation may be arranged to insulate a part of the inner tray space. Alternatively, the insulation may be arranged to insulate the entire inner tray space.

In one embodiment of the first aspect of the present invention, said insulation may be in the form of an inner lining of said receptacle having an inner recessed region so as to enable said sample to be accommodated therein. This allows for a very good thermal insulation of the sample.

According to a second aspect of the present invention, there is provided an apparatus for a calorimetric or a thermoanalytical investigation, said apparatus comprising a calorimetric or a thermoanalytical measuring apparatus and having a sample tray according to the first aspect of the present invention associated therewith so as to allow transfer of the sample from said sample tray to a measuring position in said measuring apparatus. The calorimetric or a thermoanalytical measuring apparatus (hereinafter also abbreviated as "measuring apparatus") may be a conventional measuring apparatus as it is commonly known in the art. E.g., the measuring apparatus may comprise a Differential Scanning calorimetry instrument or a Thermogravimetric Analysis instrument.

In one embodiment of the apparatus according to the second aspect of the present inventions, said calorimetric or thermoanalytical measuring apparatus may comprise a housing including an operating area for said measuring apparatus, and said sample tray may be adapted to be mounted in said operating area. The sample tray may be adapted to be permanently fixed in the operating area. Alternatively, the sample tray may be adapted to be removable from said operating area. The sample tray may be mountable in said operating area such that it is arranged in close proximity of the measuring position. In this way, a transport path from the sample tray to the measuring position may be short. Thus, the temperature of the sample may only be affected slightly or not at all during its transport from said receptacle to said measuring position. This may improve the quality of the result of the calorimetric or thermoanalytical investigation.

The apparatus may further comprise a transfer device for effecting said transfer of said sample from the sample tray to the measuring position of the calorimetric or thermoanalytical measuring apparatus. The transfer device may be adapted to grip one or several samples accommodated within the inner tray space and to transfer it/them to the measuring position of said measuring apparatus. The transfer device may operate automatically. The transfer device may be a robotic device.

The apparatus may further comprise a hood adapted to shield a path of transfer from the sample tray to said measuring position of the calorimetric or thermoanalytical measuring apparatus from the ambient environment. Then it is possible to transfer the sample from the sample tray to the measuring position along said path of transfer completely within an inner hood space defined as an inner space separated from an outside via the hood, e.g., by using a robotic transfer device as explained above. It may be possible to create desired ambient conditions inside said inner hood space. For example, it may be possible to provide a dry gas inside the inner hood space. When the sample is cooled to low temperatures in the sample tray, the dry gas may prevent icing of the sample during the transport from the sample tray to the measuring position.

In one embodiment of the second aspect according to the present invention, said measuring position may be located within a furnace of said measuring apparatus. The furnace may be arranged in a furnace housing. The measuring apparatus may further comprise a control unit that allows to control the operation of the furnace. The control unit may include a temperature program that controls the temperature of said furnace.

BRIEF DESCRIPTION OF THE DRAWINGS

In the following description, the invention will be specified in greater detail by way of examples, with reference to the drawings. In the drawings, FIG. 1 is a schematic sectional view of a sample tray according to an embodiment of the first aspect of the present invention, FIG. 2 is a schematic view of an apparatus for a calorimetric or thermoanalytical investigation according to an embodiment of the second aspect of the present invention.

DETAILED DESCRIPTION OF EXEMPLARY EMBODIMENT(S)

FIG. 1 is a schematic sectional view of a sample tray 1 according to an embodiment of the first aspect of the present invention. Said sample tray 1 comprises a receptacle 10 adapted to enclose an inner tray space 11 for accommodating a sample. Said sample comprises a material to be inspected via a calorimetric or thermoanalytical investigation.

In the embodiment shown in FIG. 1, the receptacle 10 comprises a receiving part 16 and a cover 17. The receiving part 16 is adapted to receive said sample. The receiving part 16 encloses the inner tray space 11 except in a region where an opening 15 is defined. The receiving part 16 may comprise an insulation 40 for thermally insulating the inner tray space 11 from an outer side 12. The insulation 40 may be in the form of an inner lining of the receptacle 10 having an inner recessed region so as to enable said sample to be accommodated therein. The cover 17 is adapted to close the opening 15 in a first position, and to release the opening 15 in a second position. In the embodiment shown in FIG. 1, the cover 17 is removable from the receiving part 16 thereby allowing the insertion of the sample into the inner tray space 11 and the removal of the sample from the inner tray space 11. The inner tray space 11 of the receptacle 10 shown in FIG. 1 has the form of a cuboid.

The sample tray 1 shown in FIG. 1 further comprises a support 13 for supporting at least one sample pan 14. The sample pan 14 is adapted to receive a sample of a material and is further adapted to be arranged at a measuring position located within a furnace of a calorimetric or a thermoanalytical measuring apparatus (see below). In one possible example, the support 13 may be disc-shaped. Additionally, the support 13 may be rotatable around an axis through the center of the disc. Additionally or alternatively, the support 13 may be adapted to receive 2×48 sample pans 14.

The sample tray 1 further comprises heat transport means 20 for causing heat to flow between the inner tray space 11 and the outer side 12 of said receptacle 10. In the embodiment shown in FIG. 1, the heat transport means 20 comprises a thermo-electric Peltier cooler 30 arranged within said inner tray space 11. The Peltier cooler 30 has a heat-absorbing side 31 and a heat-releasing side 32. The heat-absorbing side 31 may be in thermal contact with the support 13 and/or the sample pan 14. The heat transport means 20 of the embodiments shown in FIG. 1 further comprises a heat exchanger 24 arranged within said inner tray space 11 and being in thermal contact with the heat-releasing side 32 of the Peltier cooler 30. The heat transport means 20 further comprises a heat transfer medium, e.g., water, circulating in a circuit 26 that extends between said inner tray space 11 and the outer side 12 of the receptacle 10. The heat exchanger 24 is in connection with the circuit 26. The circuit 26 has a first end 26a connected to the heat exchanger 24 and a second end 26b connected to a cooler 27 arranged at the outer side 12 of the receptacle 10 and adapted to cool the heat transfer medium transporting heat from the heat exchanger 24 to the cooler 27. In this way, a cooling of the sample may be achieved.

FIG. 2 is a schematic view of an apparatus 100 for a calorimetric or a thermoanalytical investigation according to an embodiment of the second aspect of the present invention. The apparatus 100 comprises a calorimetric or a thermoanalytical measuring apparatus 110 (abbreviated as measuring apparatus 110) and a sample tray 1 associated therewith. The sample tray 1 may be the sample tray 1 shown in FIG. 1, though it is not limited to this. In the embodiment shown in FIG. 2, the measuring apparatus 110 comprises a housing 111. The housing 111 includes an operating area for said measuring apparatus 110 and the sample tray 1 is adapted to be mounted in said operating area.

The measuring apparatus 110 comprises a furnace 112 arranged in a furnace housing 113 and a control unit (not shown) that controls the operation of the furnace 112. The control unit includes a temperature program that controls the temperature of the furnace 112. A measuring position of the measuring apparatus 110 is located within said furnace 112.

In the embodiment shown in FIG. 2, the apparatus 100 further comprises a transfer device 120 for effecting a transfer of the sample from the sample tray 1 to the measuring position inside the furnace 112. In the embodiment shown in FIG. 2, the transfer device 120 comprises a robot arm 121. The robot arm 121 is movable along a rail 122 between a first position and a second position in a horizontal direction H. A gripper 123 is arranged at a lower end 121a of the robot arm 121, the gripper 123 being adapted to be movable along a vertical direction V perpendicular to the horizontal direction H. In the first position, the robot arm 121 is arranged above the sample tray 1. The gripper 123 is then moved in the vertical direction V through the opening 15 of the sample tray 1 (in case of the sample tray 1 shown in FIG. 1, the cover 17 must be removed beforehand). The gripper 123 is adapted to grip a sample pan 14 carrying a sample of a material. Once the gripper 123 has gripped the sample pan 14, the gripper 123 is moved upwards in the vertical direction V. Then, the robot arm 121 is moved along the rail 122 in the horizontal direction H to the left in FIG. 2 until reaching the second position where the robot arm 121 is arranged above the furnace housing 113, as it is shown in FIG. 2. Then, the gripper 123 is moved downwards in the vertical direction V through an access 114 of the furnace housing 113 (which is otherwise closed via a furnace cover, not shown) until the sample pan 14 reaches the measuring position located within the furnace housing 113. Then, the gripper 123 is retracted from the furnace 112 and the furnace cover is arranged over the access 114 to close the furnace 112. Then, the calorimetric or thermoanalytical investigation may be started.

Optionally, and as shown in the embodiment of FIG. 2, the apparatus 100 may comprise a hood 130 to enclose an inner hood space 131. Said inner hood space 131 accommodates the sample tray 1 mounted in the operating area of said housing 111, as it is shown in FIG. 2, and also the access 114 to the furnace 112 of the calorimetric or thermoanalytical measuring apparatus 110. It may be possible to create desired ambient conditions inside the inner hood space 131, e.g., by inserting a dry gas. Then, it is possible, e.g., by using the transfer device 120 explained above, to transfer the sample in the sample pan 14 under desired ambient conditions from the sample tray 1 to the measuring position located within the furnace 112. Thus, the hood 130 allows a transfer of the sample to the measuring position under desired ambient conditions. If the sample tray 1 comprises a cooler 27 as part of the heat transport means 20, preferably at least part of this cooler 27 is arranged outside the hood 130 such that the heat produced by the cooler 27 can be deposited in the ambient air.

<div style="text-align:center">LIST OF REFERENCE SIGNS</div>

1 sample tray
10 receptacle
11 inner tray space
12 outer side of the receptacle
13 support
14 sample pan
15 opening
16 receiving part
17 cover
20 heat transport means
24 heat exchanger
26 circuit
26a first end
26b second end
27 cooler
30 Peltier cooler
31 heat-absorbing side
32 heat-releasing side
40 insulation
100 apparatus for a calorimetric or a thermoanalytical investigation
110 calorimetric or thermoanalytical measuring apparatus
111 housing
112 furnace
113 furnace housing
114 access
120 transfer device
121 robot arm
121a lower end
122 rail
123 gripper
130 hood
131 inner hood space
H horizontal direction
V vertical direction

What is claimed is:

1. A sample tray for holding a sample of a material ready for a calorimetric or a thermoanalytical investigation, wherein said sample tray comprises:
a receptacle adapted to enclose an inner tray space for accommodating said sample and heat transport means for causing heat to flow between said inner tray space and an outer side of said receptacle; and
a support for a sample pan, said support being arranged within said inner tray space and being in thermal contact with said heat transport means.

2. The sample tray of claim 1, wherein:
said heat transport means comprises a thermo-electrical Peltier cooler arranged within said inner tray space;
said Peltier cooler having a heat-absorbing side and a heat-releasing side; and
said heat transport means comprises a means for causing heat to flow between said Peltier cooler and the outer side of said receptacle.

3. The sample tray of claim 1, wherein:
said heat transport means comprises a heat exchanger.

4. The sample tray of claim 1, wherein:
said heat transport means comprises a heat transfer medium circulating in a circuit that extends between said inner tray space and said outer side of said receptacle.

5. The sample tray of claim 1, wherein:
said support has a disc shape.

6. The sample tray of claim 1, wherein:
said receptacle comprises an opening for inserting said sample into said tray space and for removing said sample from said tray space, and a cover adapted to close the opening in a first position and to release the opening in a second position thereby enabling inserting and removal of said sample.

7. The sample tray of claim 1 further comprising:
a gas inlet for introducing gas into the inner tray space, and a gas outlet for removing gas from the inner tray space, thereby allowing a gas flow through said inner tray space.

8. The sample tray of claim 1 further comprising:
an insulation for thermally insulating the inner tray space from the outer side.

9. The sample tray of claim 8, wherein:
said insulation is provided as an inner lining of said receptacle having an inner recessed region for accommodating said sample.

10. An apparatus for a calorimetric or a thermoanalytical investigation, said apparatus comprising:
a calorimetric or a thermoanalytical measuring apparatus; and
the sample tray of claim 1 associated therewith so as to allow transfer of the sample from said sample tray to a measuring position in said measuring apparatus.

11. The apparatus of claim 10, wherein:
said calorimetric or thermoanalytical measuring apparatus comprises a housing including an operating area for said measuring apparatus; and
said sample tray is adapted to be mounted in said operating area.

12. The apparatus of claim 10, further comprising:
a transfer device for effecting said transfer of said sample from the sample tray to the measuring position of the calorimetric or thermoanalytical measuring apparatus.

13. The apparatus of claim 10 further comprising:
a hood adapted to shield a path of transfer from the sample tray to said measuring position of the calorimetric or thermoanalytical measuring apparatus from the ambient environment.

14. The apparatus of claim 10, wherein:
said measuring position is located within a furnace of said measuring apparatus.

15. An apparatus for a calorimetric or a thermoanalytical investigation, said apparatus comprising:
a calorimetric or a thermoanalytical measuring apparatus; and
a sample tray for holding a sample of a material ready for a calorimetric or a thermoanalytical investigation, wherein said sample tray comprises a receptacle adapted to enclose an inner tray space for accommodating said sample and heat transport means for causing heat to flow between said inner tray space and an outer side of said receptacle.

<div style="text-align:center">* * * * *</div>